(12) United States Patent
Boss

(10) Patent No.: US 11,474,158 B2
(45) Date of Patent: Oct. 18, 2022

(54) ANALYZING ELECTRICAL IMPEDANCE MEASUREMENTS OF AN ELECTROMECHANICAL BATTERY

(71) Applicant: NOVUM engineerING GmbH, Dresden (DE)

(72) Inventor: Valentin Boss, Dresden (DE)

(73) Assignee: NOVUM ENGINEERING GMBH, Dresden (DE)

( * ) Notice: Subject to any disclaimer, the term of this patent is extended or adjusted under 35 U.S.C. 154(b) by 64 days.

(21) Appl. No.: 17/077,880

(22) Filed: Oct. 22, 2020

(65) Prior Publication Data

US 2021/0123977 A1    Apr. 29, 2021

(30) Foreign Application Priority Data

Oct. 23, 2019   (EP) .................................. 19 204 751

(51) Int. Cl.
    *G01R 31/389*      (2019.01)
    *G01R 31/392*      (2019.01)
    (Continued)

(52) U.S. Cl.
    CPC ......... *G01R 31/389* (2019.01); *G01R 31/367* (2019.01); *G01R 31/382* (2019.01); *G01R 31/392* (2019.01)

(58) Field of Classification Search
None
See application file for complete search history.

(56) References Cited

U.S. PATENT DOCUMENTS

| | | | |
|---|---|---|---|
| 4,678,998 A | 7/1987 | Muramatsu | |
| 6,307,378 B1 | 10/2001 | Kozlowski | |

(Continued)

FOREIGN PATENT DOCUMENTS

| | | |
|---|---|---|
| DE | 112015005201 T5 | 7/2017 |
| DE | 112016002873 T5 | 3/2018 |

(Continued)

OTHER PUBLICATIONS

European Patent Office, Extended European Search Report and Opinion, European Patent Application 19204751.2, dated May 19, 2020, six pages.

*Primary Examiner* — Brent A. Fairbanks
(74) *Attorney, Agent, or Firm* — Fenwick & West LLP

(57) ABSTRACT

A computer-implemented method and an electrical impedance analyzing system for analyzing electrical impedance measurements of an electrochemical battery, including: a translating of respective electrical impedance measurements that corresponds to subtracting an ohmic alternating current resistance value from the real part of electrical impedance; and a scaling using scaling factors, the absolute values of which are based on an electrical impedance that corresponds to a transition between a translated first subseries and a translated second subseries of the series of electrical impedance measurements, the first subseries being associated with a battery behavior of the electrochemical battery in which the electrical impedance is dominated by diffusion processes, the second subseries being associated with a battery behavior of the electrochemical battery in which the electrical impedance is dominated by charge transfer processes at the electrodes of the battery.

14 Claims, 4 Drawing Sheets

(51) Int. Cl.
    *G01R 31/367*     (2019.01)
    *G01R 31/382*     (2019.01)
    *G06N 3/02*     (2006.01)

(56) References Cited

U.S. PATENT DOCUMENTS

| | | | |
|---|---|---|---|
| 8,718,380 B2* | 5/2014 | Porikli | G06V 10/46 |
| | | | 382/209 |
| 8,994,340 B2 | 3/2015 | Matthe et al. | |
| 9,548,506 B2 | 1/2017 | Yamazaki et al. | |
| 2003/0184307 A1 | 10/2003 | Kozlowski et al. | |
| 2013/0207671 A1 | 8/2013 | Torai et al. | |
| 2013/0307487 A1 | 11/2013 | Matthe et al. | |
| 2018/0056809 A1 | 3/2018 | Uchida | |
| 2018/0067169 A1* | 3/2018 | Nishi | G01R 31/389 |
| 2018/0143257 A1* | 5/2018 | Garcia | G01R 31/382 |
| 2020/0200825 A1* | 6/2020 | Izumi | G01R 31/367 |
| 2020/0200826 A1* | 6/2020 | Izumi | G06N 3/04 |

FOREIGN PATENT DOCUMENTS

| | | |
|---|---|---|
| DE | 112016003789 T5 | 5/2018 |
| EP | 1129343 B1 | 6/2008 |
| EP | 1702219 B1 | 5/2012 |
| JP | 2003-249271 A | 9/2003 |
| JP | 4038788 B2 | 1/2008 |
| WO | WO 00/16083 A1 | 3/2000 |
| WO | WO 03/071617 A2 | 8/2003 |
| WO | WO 2005/059579 A1 | 6/2005 |
| WO | WO 2016/080111 A1 | 5/2016 |
| WO | WO 2016/208745 A1 | 12/2016 |
| WO | WO 2017/110437 A1 | 6/2017 |

* cited by examiner

ANALYZING ELECTRICAL IMPEDANCE MEASUREMENTS OF AN ELECTROMECHANICAL BATTERY

CROSS-REFERENCE TO RELATED APPLICATION

This application claims priority to European Patent Application No. 19 204 751.2 filed on Oct. 23, 2019, which is incorporate by reference herein in its entirety.

BACKGROUND

The invention relates to a computer-implemented method of analyzing electrical impedance measurements of an electrochemical battery. Furthermore, the invention relates to an electrical impedance analyzing system for analyzing electrical impedance measurements of an electrochemical battery.

For example, the computer may be a microcontroller. For example, the computer or microcontroller may include a processing unit, a memory, and input/output ports.

WO 2005/059579 A1 and EP 1702219 B1 describe an apparatus and a method for estimating a state of charge of a battery by using a neural network. The apparatus includes a sensing section for detecting current, voltage and a temperature from a battery cell and a neural network performing a neural network algorithm and a learning algorithm based on data of the current, voltage and temperature transmitted thereto from the sensing section and present time data.

U.S. Pat. No. 4,678,998 A describes a battery condition monitor and a monitoring method. The monitor includes a computer for computing internal impedances of the storage battery from different frequency components of voltage and amperage signals from the battery, a memory for storing predetermined relationships between the internal impedance, remaining capacity and remaining service life of the storage battery for each of the frequencies and a device for determining the remaining capacity and remaining service life values for the storage battery in agreement at both or all frequency values.

JP 2003-249271 A and JP 4038788 B2 describe the determining of a deterioration state and a residual capacity of a battery in real time. In an example, as an operation parameter of the battery under operation, a measurement unit can measure and sample periodically the voltage of the battery, the current, the internal impedance, and the temperature. The internal impedance of the battery is measured by adding an AC signal of 1 kHz and 100 mA to the battery. A first neural network can decide on a deterioration state as "normal", "caution", and "degradation", based on the operation parameter of the battery from the measurement unit, and a second neural network can decide on the residual capacity based on the operation parameter of the battery and the deterioration state from the first neural network.

U.S. Pat. No. 6,307,378 B1 describes a method and an apparatus for measurement of electrochemical cell and battery impedances.

WO 03/071617 A2 describes a method for determining a condition parameter of an electrochemical cell, such as in a battery. In an example, measurement signals such as terminal voltages, cell voltages, load current, charging current, ambient temperature, battery surface temperature, terminal temperature, internal battery temperature, and impedance signals are passed to a feature extraction processing algorithm, which generates a feature vector and a feature flag. Data from the feature vector is passed to a neural network ISOC predictor for initial battery capacity state of charge estimation, and a neural network CSOC predictor for continuous prediction of SOC during operation. In another example, the information contained in a feature vector is used by a neural network SOH classifier, a linear/statistical SOH classifier, and a fuzzy logic SOH classifier for state of health classification.

WO 2016/208745 A1 and its translation DE 112016002873 T5 describe a method of recognizing the state of charge or depth of discharge of a battery. The method includes determining the complex impedance between the positive and negative electrodes of a battery with respect to a plurality of frequencies.

WO 2017/110437 A1 and its translation DE 11 2016 003 789 T5 describe an estimation device that estimates the residual capacity of a lithium ion battery.

WO 2016/080111 A1 and its translation DE 11 2015 005 201 T5 describe an estimation device for estimating a remaining stored power amount of a storage battery.

US 2013/0307487 A1 and U.S. Pat. No. 8,994,340 B2 describe a method and a system for determining the temperature of cells in a battery pack, without using temperature sensors, by measuring the impedance of the cells and using the impedance to determine the temperature.

WO 00/16083 and EP 1129343 B1 describe a device that measures real and imaginary parts of complex immittance of a cell or battery at n discrete frequencies. The device determines cell/battery properties by evaluating components of an equivalent circuit model.

Conventional methods or devices that determine battery properties using a model of the battery or using known values have to be specifically adapted for a particular battery. For example, usually, different electrical impedances are measured for different batteries of the same battery type. Moreover, different electrical impedances are measured for different battery types. For example, different electrical impedances are measured for a lithium iron phosphate ($LiFePO_4$) battery cell and a lithium cobalt oxide ($LiCoO_2$) battery cell, due to different chemical properties of the cell. Furthermore, different electrical impedances may be measured depending on additives of the electrolytes.

In the prior art, determining the remaining capacity and the remaining service life of a storage battery from electrical impedances is only possible for a specific storage battery, for which storage battery the relationships between the electrical impedance and the remaining capacity and remaining service life have been determined beforehand and stored for each of different frequencies.

SUMMARY OF THE INVENTION

Embodiments relate to analyzing electrical impedance measurements of an electrochemical battery which is applicable to different batteries, battery configurations and/or battery types of electrochemical batteries, in particular, rechargeable electrochemical batteries.

Embodiments also relate to a method and apparatus that can be readily applied to different electrochemical batteries of, for example, a specific battery type, without requiring an adapting of the method or apparatus to the particular battery.

According to one aspect of the invention, there is provided a computer-implemented method of analyzing electrical impedance measurements of an electrochemical battery, the method comprising: (i) providing a series of electrical impedance measurements of an electrochemical battery, each electrical impedance measurement being measured at a respective measurement frequency, the series being ordered according to the respective measurement frequencies, (ii) identifying at least three subseries within the provided series of electrical impedance measurements, a first subseries of the three subseries being associated with a battery behavior of the electrochemical battery in which the electrical impedance is dominated by diffusion processes, a second subseries of the three subseries being associated with a battery behavior of the electrochemical battery in which the electrical impedance is dominated by charge transfer processes at the electrodes of the battery, a third subseries of the three subseries being separated from the second subseries at a position that corresponds to a zero-crossing in the complex plane of the imaginary part of electrical impedance, and (iii) transforming at least the first subseries and the second subseries of the series of electrical impedance measurements to provide a transformed series of electrical impedance measurements, the transformed series of electrical impedance measurements having a predetermined number of elements, the transformed series of electrical impedance measurements including a transformed first subseries corresponding to the first subseries of the electrical impedance measurements and a transformed second subseries corresponding to the second subseries of the electrical impedance measurements, the transforming including: (i) translating of the respective electrical impedance measurements that corresponds to subtracting an ohmic alternating current (AC) resistance value from the real part of electrical impedance, wherein the ohmic alternating current resistance value is determined according to a real part of electrical impedance at the zero-crossing in the complex plane of the imaginary part of electrical impedance which zero-crossing in the complex plane corresponds to the position at which the third subseries of the three subseries is separated from the second subseries; and (ii) scaling of the respective translated electrical impedance measurements that corresponds to scaling the real part and the imaginary part of electrical impedance by respective scaling factors, the absolute values of which are determined based on the absolute values of the real part and the imaginary part, respectively, of an electrical impedance that corresponds to a transition between the translated first subseries of the series of electrical impedance measurements and the translated second subseries of the series of electrical impedance measurements.

By the step of transforming, a transformed series of electrical impedance measurements is constructed based on the provided series of electrical impedance measurements.

Herein, the term "complex plane", unless specified otherwise, is to be understood as the complex plane of electrical impedance. For example, the term "zero-crossing in the complex plane of the imaginary part of electrical impedance" refers to a position in the complex plane of electrical impedance, at which position the imaginary part of electrical impedance crosses a value of zero.

The battery behavior of a particular battery may be dominated by diffusion processes and charge transfer processes at frequencies, which frequencies are highly dependent on the individual battery and, in particular, on a geometry and size of the battery, number of battery cells, circuitry connecting the battery cells in parallel and/or serially, etc. Due to the translating and scaling steps, the provided electrical impedance measurements stemming from a particular battery are brought into a normalized shape with respect to said processes. Thus, electrical impedance measurements from even such different configurations including serially connected battery cells and/or battery cells connected in parallel may be brought into a transformed form, in which the differences in the electrical impedances that result from the different configurations are suppressed; thus, the electrical impedance measurements are made comparable, and are suitable for automated evaluation of a battery state, for example, using a neural network, without having to train the neural network for a new battery configuration or battery each time a new battery is to be analyzed.

The method operates on measurement data in the form of electrical impedance measurements of an electrochemical battery, in order to provide a transformed series of electrical impedance measurements. Therefore, the transformed series of electrical impedance measurements is provided that is particularly well suitable as an input for a battery state estimator comprising computational means, such as artificial neural network means. The elements of the series may be fed to corresponding inputs of the battery state estimator, or, more specifically, to corresponding inputs of an artificial neural network of the battery state estimator. Thus, an automated battery state estimation based on the provided transformed series is facilitated.

Preferably, the electrochemical battery is a rechargeable electrochemical battery.

Estimating a battery state in the form of the state of charge is highly relevant, for example, for mobile appliances such as mobile tools or mobile, electrically driven apparatuses, such as vehicles.

Similarly, an estimation of a battery state in the form of the state of health is of high importance with respect to a reliability of a device.

Due to the translating and scaling steps, it can be assured that in the transformed series of electrical impedance measurements, the shape of the curve progression in the complex plane of the electrical impedance over the course of the measurement frequency (that is, with increasing or decreasing measurement frequency) is emphasized relative to the specific values of the real part and imaginary part of the electrical impedance measurements. That is, the curve progression is relatively more pronounced, whereas the absolute values are relatively suppressed. Thereby, a battery state may be evaluated for different configurations and/or types of electrochemical batteries based on overall features of the progression of the electrical impedance with, for example, increasing measurement frequency, while avoiding or minimizing a bias due to differences in absolute values of the real part or imaginary part of the electrical impedance.

Whereas the ohmic AC resistance value $R_O$ of the impedance at the point of zero imaginary part has been suggested as an indicator for the deterioration of a rechargeable battery, this holds only for a specific battery; for different batteries, however, different values of $R_O$ occur that are an attribute of the different batteries rather than being an indicator for the deterioration. In contrast, the transformed series represents the characteristic features of the electrical impedance spectrum (that is, the series of measurements) as features in relation to the transition. Thus, information from the spectrum is made available for estimating a battery state, in which inherent differences between different batteries are suppressed, while exhibiting those features that are characteristic for a battery state.

The electrical impedance may also be termed a complex electrical impedance and may be a complex number and may be provided being expressed in a unit of electrical resistance, for example, ohm.

For example, each electrical impedance measurement of the provided series of electrical impedance measurements may be or include a complex number that defines a real part and an imaginary part of the respective electrical impedance. The electrical impedance may also be represented in polar form, defining a magnitude (or amplitude) and an angle (or phase).

For example, the electrical impedance measurements of the provided series of electrical impedance measurements may be in the form of respective complex representations (complex numbers). Or, for example, the electrical impedance measurements may each be in the form of amplitude and phase, and the step of providing may comprise converting the electrical impedance measurements into electrical impedance measurements in the form of respective complex representations of the electrical impedance measurements. A "complex representation" of an electrical impedance measurement comprises a complex number. For example, the complex representation of an electrical impedance measurement may be a complex number.

The zero-crossing may be a zero-crossing over the course of the index of measurements (a value of zero is crossed with increasing index) or over the course of the measurement frequency (a value of zero is crossed with increasing measurement frequency).

Herein, the signs of the real part and imaginary part of the electrical impedance are defined according to the battery impedance or internal resistance of the battery being regarded as an electric load, or energy sink. Therefore, at frequencies lower than at the zero-crossing in the complex plane of the imaginary part of electrical impedance, the imaginary part of the electrical impedance is negative, whereas at frequencies higher than at the zero-crossing, the imaginary part of the electrical impedance is positive.

Herein, the term "battery" is to be understood as including a battery cell. The battery may include one or more battery cells. In particular, the term "battery" includes a battery cell as well as a battery composed of multiple battery cells.

Specifically, the electrochemical battery is understood as defining a device consisting of one or more electrochemical cells with external electrical connections. For example, the battery may include two external electrical connections for drawing power from the one or more electrochemical cells and, in case of a rechargeable battery, for (re-)charging the one or more electrochemical cells.

Herein, the terms "absolute value" and "magnitude" are used interchangeably. For a real number (such as a real part or an imaginary part of a complex number), the term "absolute value" is understood as the non-negative value of the real number without regard to its sign. For a complex number x+iy, the term "absolute value" or "magnitude" is understood as the square root of $x^2+y^2$.

For example, the respective measurement frequency may be a frequency of a signal input to the electrochemical battery. For example, the signal may be a sinusoidal signal.

Preferably, the first, second and third subseries are consecutively arranged within the series of electrical impedance measurements.

Preferably, each electrical impedance measurement of the transformed series of electrical impedance measurements comprises a complex number that defines a real part and an imaginary part of the respective electrical impedance measurement.

For example, the position at which the third subseries of the three subseries is separated from the second subseries may be a position in the complex plane. For example, the position may be the position of the zero-crossing of the imaginary part of electrical impedance.

For example, the method may be a computer-implemented method of analyzing electrical impedance measurements of an electrochemical battery, and of transforming the electrical impedance measurements for automated evaluation of at least one battery parameter of the electrochemical battery. Due to the transforming step, the transformed electrical impedance measurements are provided which are particularly suitable for automated evaluation of a battery parameter of the battery.

Preferably, the series of electrical impedance measurements are provided in the form of a digital signal.

Preferably, the series of electrical impedance measurements of the electrochemical battery are provided in a digitally represented form.

The series of electrical impedance measurements may be received from an electrical impedance measuring unit or electrical impedance measuring means, for example.

Providing the series of electrical impedance measurements may comprise receiving the electrical impedance measurements of the series one after another.

The series of electrical impedance measurements may be communicated to an electrical impedance analyzing system comprising means for carrying out the steps of the method. The system may be configured for providing (including receiving) the communicated electrical impedance measurements.

In one or more embodiments, the measurement frequencies are assumed to be logarithmically equidistantly spaced. Preferably, the measurement frequencies are logarithmically equidistantly spaced over at least four decades of the measurement frequency range (the frequency range of the measurement frequencies), more preferably over at least five decades of the measurement frequency range.

Preferably, the measurement frequencies include a measurement frequency in the range of 0.1 to 1.0 Hz.

Preferably, the measurement frequencies include a measurement frequency in the range of 1 kHz to 10 kHz.

Preferably, the measurement frequencies include at least 4 (four) measurement frequencies per decade of the measurement frequency range, more preferably at least five measurement frequencies per decade of the measurement frequency range.

The step of providing the series of electrical impedance measurements may comprise receiving a plurality of electrical impedance measurements, each electrical impedance measurement being measured at a respective measurement frequency, and:
- arranging the plurality of electrical impedance measurements according to the associated measurement frequencies to provide the series of electrical impedance measurements, or
- providing the plurality of the electrical impedance measurements as the series of electrical impedance measurements.

For example, the arranged plurality of electrical impedance measurements, optionally including the respective measurement frequencies, may be provided as the series of electrical impedance measurements.

The plurality of electrical impedance measurements, or the series of electrical impedance measurements may be received in the form of an electrical impedance spectrum.

In the series of electrical impedance measurements, for example, the electrical impedance measurements may include the respective measurement frequencies. For example, each electrical impedance measurement may include the measured value of the electrical impedance and the measurement frequency. However, the electrical impedance measurements may as well be in the form of respective electrical impedances, represented as respective complex numbers, or each represented as an amplitude and phase.

The method comprises identifying three subseries within the provided series of electrical impedance measurements. That is, the three subseries are determined.

The first subseries is associated with a battery behavior of the electrochemical battery in which the electrical impedance is dominated by diffusion processes. That is, the first subseries is associated with a frequency response behavior of the electrochemical battery wherein the electrical impedance is dominated by diffusion processes, for the respective measurement frequencies of the first subseries. This is expected for first measurement frequencies, which are relatively low frequencies.

The second subseries is associated with a battery behavior of the electrochemical battery in which the electrical impedance is dominated by charge transfer processes at the electrodes of the battery. That is, the second subseries is associated with a frequency response behavior of the electrochemical battery wherein the electrical impedance is dominated by charge transfer processes at the electrodes of the battery, for the respective measurement frequencies of the second subseries. This is expected for second measurement frequencies, which are intermediate frequencies between the first measurement frequencies and third measurement frequencies of the third subseries.

The third subseries is separated from the second subseries at a position that corresponds to a zero-crossing in the complex plane of the imaginary part of electrical impedance. For example, the third subseries may be associated with a battery behavior of the electrochemical battery in which the electrical impedance is mainly an imaginary reactive impedance; for example, in the third subseries, the electrical impedance may have a positive imaginary part; for example, the electrical impedance may be dominated by ohmic and/or inductive characteristics of a cell geometry and of conductors/connectors of the battery. This is expected for third measurement frequencies, which are relatively high frequencies.

For example, the zero-crossing may be a zero-crossing of the imaginary part of an interpolation of the series of electrical impedance measurements. That is, for example, consecutive measurements of the series of measurements may be determined that show a changing of the sign (positive/negative) of the imaginary part of electrical impedance, the series of electrical impedance measurements may be interpolated in a region including these measurements (for example, by linear interpolation, spline interpolation, or polynomial interpolation), and a position of a zero-crossing of the imaginary part of the interpolation of the series may be determined as the position separating the second and third subseries.

For example, the method may comprise identifying a transition between a first subseries of the series of electrical impedance measurements, which first subseries is associated with a battery behavior of the electrochemical battery in which the electrical impedance is dominated by diffusion processes, and a second subseries of the series of electrical impedance measurements, which second subseries is associated with a battery behavior of the electrochemical battery in which the electrical impedance is dominated by charge transfer processes at the electrodes of the battery, and the first subseries and the second subseries may be identified based on the identified transition.

For the first and second subseries, the real part of the series of electrical impedance measurements is expected to decrease with increasing measurement frequencies. However, the imaginary part of the series of electrical impedance measurements is expected to show pronounced features, which are different for the first and second subseries.

The information on decreasing or increasing measurement frequencies is available due to the provided series of electrical impedance measurements being ordered according to the measurement frequencies; the greatest values of the positive real part of electrical impedance are expected to be measured at the lowest measurement frequencies.

Hereinafter, the terms "local relative maximum" or "local relative minimum" may refer to a local relative extremum over the course of the series of measurements (that is, within a number of consecutive elements of the series of measurements), or to a local relative extremum in the curve progression (curve shape) of the complex impedance in the complex plane. These definitions may be used interchangeable, because the real part of the series of electrical impedance measurements is expected to decrease with increasing measurement frequencies in the first and second subseries towards the zero-crossing of the imaginary part. A local relative extremum of the imaginary part in the curve progression (curve shape) of the complex impedance in the complex plane corresponds to a local relative extremum of the imaginary part over the course of the real part of the series of measurements (that is, a relative extremum of the imaginary part within a number of consecutive elements of the series of measurements). Optionally, the local relative maximum or minimum may be a local relative maximum or minimum when smoothing and/or interpolating the series of electrical impedance measurements. For example, a moving average may be used for smoothing.

Likewise, the terms "increasing towards" or "decreasing towards", unless specified otherwise, may refer to an increasing/decreasing over the course of the series of measurements (that is, with increasing or decreasing index of the series), or may refer, at least for the first and second subseries, to an increasing/decreasing over the course of the real part of the series of measurements (that is, with increasing or decreasing real part of the series). The direction of increasing/decreasing is defined by the increasing/decreasing being "towards" some point, element, or feature of the series.

For example, the second subseries of the three subseries may be separated from the first subseries at a transition, the transition forming a local relative maximum of the imaginary part of the series of electrical impedance measurements. For example, the transition may form a local relative maximum of the imaginary part of an interpolation of the series of electrical impedance measurements. The transition may be determined by interpolation, for example, using spline interpolation or polynomial interpolation. That is, for example, the local relative maximum may be determined, the series of electrical impedance measurements may be interpolated in a region around the local relative maximum, and a new local relative maximum of the interpolation of the series may be determined as the transition between the first and second subseries.

The local relative maximum of the imaginary part may be negative, that is, less than zero. For example, the local relative maximum may be a local minimum of the absolute value of the negative imaginary part of the series of electrical impedance measurements. That is, in a range including the transition, the electrical impedance measurements may have a negative imaginary part, respectively.

In case the identified step has a negative result in that at least one of the first and second subseries can not be identified, a deterioration signal is generated, and the identifying step and the method are interrupted. This could be the case, for example, due to an unexpected curve progression of the provided series of electrical impedance measurements in the complex plane, which could, for example, occur in case of a deterioration of the electrochemical battery.

For example, the transforming step may comprise assembling the transformed first subseries, and the transformed second subseries and, optionally, the transformed third subseries, to the transformed series of electrical impedance measurements.

The absolute values of the scaling factors are determined based on the absolute values of the real part and the imaginary part, respectively, of an electrical impedance that corresponds to the transition between the translated first subseries and the translated second subseries. For example, the absolute values of the scaling factors may be proportional to the absolute values of the real part and the imaginary part, respectively, of an electrical impedance that corresponds to the transition.

For example, the absolute values of the scaling factors may correspond to the absolute values of the real part and the imaginary part, respectively, of an electrical impedance that corresponds to the transition. Preferably, in the transformed series of electrical impedance measurements, the real parts of the electrical impedance measurements of the second subseries are in a range from 0.0 to 1.0, due to the translating and scaling operations. Moreover, preferably, the transition between the first subseries and the second subseries is at a complex impedance having an imaginary part of −1.0 and having a real part of 1.0. Consequently, the real parts of the electrical impedance measurements of the first subseries of the transformed series of electrical impedance measurements are in the range of greater than or equal to 1.0. And, the imaginary parts of the electrical impedance measurements of the third subseries, if applicable, are in the range of being greater than or equal to 0.0.

The features of the curve progression of the provided series of electrical impedance measurements in the complex plane are preserved by the transforming step.

In a simple implementation of one or more embodiments, the transition between the translated first subseries of the series of electrical impedance measurements and the translated second subseries of the series of electrical impedance measurements may be determined (that is, assumed) to be at a position corresponding to a measurement frequency of a predetermined value of, for example, 1.0 Hz. This position is to be understood as a position in the complex plane of electrical impedance.

In one or more embodiments, the method may comprise adjusting the number of elements of the series of electrical impedance measurements or the number of elements of the transformed series of electrical impedance measurements to a predetermined number of elements. The step of adjusting may be performed on the series of electrical impedance measurements before, between, or after the steps of identifying, translating and scaling. In other words, the series of electrical impedance measurements may be subjected to the adjusting of the number of elements of the series of electrical impedance measurements before, between, or after the steps of identifying, translating and scaling.

Thus, the step of adjusting may include grouping the electrical impedance measurements, and separating the electrical impedance measurements into the first subseries, the second subseries, and the third subseries, which correspond to zones of different electrochemical behavior of the electrical impedance.

In case the step of adjusting is performed on the series of electrical impedance measurements between the steps of identifying, translating and scaling, it may be performed between the steps of identifying and translating, or between the steps of translating and scaling.

For example, adjusting the number of elements of the series of electrical impedance measurements or the number of elements of the transformed series of electrical impedance measurements may comprise at least one of interpolating between electrical impedance measurements, selecting from the electrical impedance measurements, and extrapolating the electrical impedance measurements. In the adjusting step, the number of elements may be increased, maintained, or decreased.

For example, adjusting the number of elements of the series of electrical impedance measurements to a predetermined number of elements may comprise selecting elements of only the elements of the first subseries and the second subseries of the three subseries, as elements of the series of electrical impedance measurements having the predetermined number of elements. For example, after determining the zero-crossing in the complex plane of the imaginary part of electrical impedance, which separates the third subseries from the second subseries, the elements of the third subseries may be discarded from the series of electrical impedance measurements.

In one or more embodiments, in the transformed series of electrical impedance measurements, each of the transformed first subseries and the transformed second subseries have a respective predetermined number of elements. For example, the third transformed subseries may also have a respective predetermined number of elements.

Thus, in the transformed series, different subseries that have been identified may be provided in the form of respective predetermined numbers of elements of the transformed series.

In one or more embodiments, the method may comprise adjusting the number of elements of the series of electrical impedance measurements to a predetermined number of elements, wherein the number of elements of each of the transformed first subseries and transformed second subseries of the transformed series of electrical impedance measurements may be adjusted to a respective predetermined number of elements. For example, the number of elements of the third transformed subseries may also be adjusted to a respective predetermined number of elements.

For example, the step of adjusting the number of elements of the series of electrical impedance measurements may be performed after the step of identifying. The step of adjusting may be performed before, between, concurrently with, or after the steps of translating and scaling.

For example, in the transformed series, each of the first subseries and second subseries of the transformed series of electrical impedance measurements may have a respective predetermined number of elements; and the method may comprise adjusting the number of elements of the series of electrical impedance measurements, wherein the number of elements of each of the first subseries and second subseries of the transformed series of electrical impedance measurements is adjusted to the respective predetermined number of elements.

Due to the first transformed subseries and the second transformed subseries having a respective predetermined number of elements or being adjusted to have a respective predetermined number of elements, it can be assured that specific first inputs of a battery state estimator or artificial neural network means receiving the provided transformed series of electrical impedance measurements will receive electrical impedance measurement data stemming from the identified first subseries that is associated with a battery behavior in which the electrical impedance is dominated by diffusion processes, while specific second inputs of the battery state estimator will receive electrical impedance measurement data stemming from the identified second subseries that is associated with a battery behavior in which the electrical impedance is dominated by charge transfer processes at the electrodes of the battery.

In the step of transforming, the transformed series of electrical impedance measurements may be provided for processing by a battery state estimator to determine a battery state of the electrochemical battery.

For example, the transformed series of electrical impedance measurements may be provided without the measurement frequencies.

The method may comprise outputting the provided transformed series of electrically impedance measurements. For example, the transformed series of electrical impedance measurements may be output to a battery state estimator, in particular, to a battery state estimator having computational means (such as artificial neural network means) configured to receive as inputs the transformed series of electrical impedance measurements and configured to process the transformed series of electrical impedance measurements to generate therefrom at least one output signal representing a battery state associated with the electrochemical battery.

For example, computational means such as artificial neural network means may be configured to receive as first inputs the elements of the first subseries of the transformed series of electrical impedance measurements, and configured to receive as second inputs the elements of the second subseries of the transformed series of electrical impedance measurements. The number of first inputs may correspond to the predetermined number of elements of the first subseries, and the number of second inputs may correspond to the predetermined number of elements of the second subseries.

The step of transforming may comprise transforming the third subseries of the series of electrical impedance measurement, wherein the transformed series of electrical impedance measurements includes a transformed third subseries corresponding to the third subseries of the electrical impedance measurements. Thus, the third subseries of electrical impedance measurements may also be used as inputs for determining a battery state of the electrochemical battery.

For example, in the step of adjusting, the number of elements of the transformed third subseries may also be adjusted to a predetermined number of elements.

In one or more embodiments, the step of identifying may comprise determining a local relative maximum of the imaginary part of the series of electrical impedance measurements, the local relative maximum being separated by other elements of the series of electrical impedance measurements from a zero-crossing in the complex plane of the imaginary part of electrical impedance of the series of electrical impedance measurements, wherein optionally the local relative maximum is a local relative maximum when smoothing and/or interpolating the series of electrical impedance measurements. In particular, the local relative maximum may be negative. In particular, the position of the local relative maximum may be determined as the transition between the translated first subseries of the series of electrical impedance measurements and the translated second subseries of the series of electrical impedance measurements.

This will become further comprehensible from FIG. 2 and the corresponding description.

For example, the step of identifying may comprise determining a transition between one subseries of the series of electrical impedance measurements and a further subseries of the series of electrical impedance measurements, wherein the one subseries of electrical impedance measurements has imaginary parts of electrical impedance that are negative and that have a magnitude which decreases towards the transition, and wherein the further subseries of electrical impedance has imaginary parts of electrical impedance that are negative and that have a magnitude which increases and then decreases towards the transition; wherein decreasing and increasing refers to increasing or decreasing over the course of the index of the elements of the series.

For example, the first subseries may be identified based on a decreasing magnitude of a negative imaginary part of electrical impedance and a decreasing magnitude of a positive real part of electrical impedance, for increasing measurement frequencies, towards a transition between the first subseries and the second subseries.

For example, the second subseries may be identified based on a curve progression of the magnitude of the negative imaginary part of electrical impedance over the course of increasing measurement frequencies (or over the course of decreasing real part) that forms at least one round peak or arc, while the real part is positive and decreases with increasing measurement frequencies.

Thus, the first subseries and the second subseries may be identified based on the curve shape of the series of electrical impedance measurements in the complex plane.

For example, the first subseries may be identified based on a curve progression in the complex plane of the electrical impedance showing a correlation between the magnitude of the negative imaginary part of electrical impedance and the magnitude of the positive real part of electrical impedance, the magnitudes declining towards a transition to the second subseries. And, for example, as the separation of the third subseries from the second subseries can be easily identified based on the zero-crossing in the complex plane of the imaginary part of electrical impedance, the second subseries may be identified based on the identified first subseries and/or the transition between the first and second subseries, and based on the identified position that corresponds to the zero-crossing in the complex plane of the imaginary part of electrical impedance. In other words, those electrical impedance measurements in the series of electrical impedance measurements that are arranged between the transition and the zero-crossing of the imaginary part are determined to be the second subseries of the three subseries.

For example, the identifying step may comprise: identifying a transition in the form of a local minimum of the absolute value of the negative imaginary part in the curve progression in the complex plane of the series of measurements relatively lower measurement frequencies; identifying a zero-crossing of the imaginary part of the electrical impedance at relatively higher measurement frequencies; and identifying the first, second, and third subseries based on the transition and the zero-crossing.

For example, the imaginary parts of electrical impedance of the first and second subseries may be negative.

In one or more embodiments, the step of identifying comprises determining a transition between one subseries of the series of electrical impedance measurements and a further subseries of the series of electrical impedance measurements, wherein the one subseries of electrical impedance measurements has imaginary parts of electrical impedance that are negative and that have a magnitude which basically (that is, at least for the most part of the subseries) increases towards the transition, and wherein the further subseries of electrical impedance has imaginary parts of electrical impedance that are negative and that have a magnitude which basically increases and then basically decreases (that is, at least for the most part of the subseries, first increases and then decreases) towards the transition.

In one or more embodiments, the first subseries and the second subseries are identified based on the determined local relative maximum of the imaginary part of the series of electrical impedance measurements, or based on the determined transition between the one subseries of the series of electrical impedance measurements and the further subseries of the series of electrical impedance measurements.

In one or more embodiments, the method comprises: determining a battery state of the electrochemical battery using computational means configured to receive as inputs the transformed series of electrical impedance measurements, wherein the computational means receives and processes the transformed series of electrical impedance measurements to generate therefrom at least one output signal representing a battery state associated with the electrochemical battery.

Thus, the method is a method of automatically evaluating a battery state of an electrochemical battery.

Thus, an output signal is generated that represents a battery state associated with the electrochemical battery. For example, the at least one output signal may represent a classification and/or an estimation of a battery state.

The battery state may include at least one of a state of charge (SoC) of the electrochemical battery, a state of health (SoH) of the electrochemical battery, a state of function (SoF) of the electrochemical battery, a capacity of the electrochemical battery, and a temperature of the electrochemical battery.

For example, the output signal may include a visual signal, which may be displayed.

For example, the output signal may be transmitted or communicated or output to an output unit for outputting the signal.

Preferably, the computational means include artificial neural network means configured to receive as inputs the transformed series of electrical impedance measurements.

In one or more embodiments, the method comprises: determining a battery state of the electrochemical battery with artificial neural network means configured to receive as inputs the transformed series of electrical impedance measurements, wherein the artificial neural network means receives and processes the transformed series of electrical impedance measurements to generate therefrom at least one output signal representing a battery state associated with the electrochemical battery.

In particular, the artificial neural network means may receive and process the transformed series of electrical impedance measurements to generate therefrom the at least one output signal in accordance with a predetermined processing structure of the artificial neural network means.

For example, the computational means or the artificial neural network means may receive and process the transformed series of electrical impedance measurements to generate therefrom at least one output signal representing a state of charge of the electrochemical battery.

For example, the computational means or the artificial neural network means may receive and process the transformed series of electrical impedance measurements to generate therefrom at least one output signal representing a state of health of the electrochemical battery.

For example, the computational means or the artificial neural network means may receive and process the transformed series of electrical impedance measurements to generate therefrom at least one output signal representing a state of function of the electrochemical battery.

For example, the computational means or the artificial neural network means may receive and process the transformed series of electrical impedance measurements to generate therefrom at least one output signal representing a temperature associated with the electrochemical battery.

The computational means or the artificial neural network means may generate more than one output signal, the respective output signals representing respective battery states of the electrochemical battery. The battery states may include one or more of the battery states mentioned above. For example, the generated output signals may include an output signal representing state of charge of the electrochemical battery, an output signal representing a state of health of the electrochemical battery, and/or an output signal representing a temperature of the electrochemical battery, or a temperature associated with the electrochemical battery, etc.

In particular, the computational means or artificial neural network means may be configured to receive as first inputs the first subseries of the transformed series of electrical impedance measurements and configured to receive as second inputs the second subseries of the transformed series of electrical impedance measurements. For example, an input (such as an input vector or input array) of the computational means or artificial neural network means may include the first inputs and the second inputs.

For example, the artificial neural network means may include a deep neural network (DNN). A deep neural network has an input layer, more than one hidden layer, and an output layer.

For example, the artificial neural network means may include a convolutional neural network (CNN).

Convolutional neural networks are known for classifying images, for example. A convolutional neural network has an input layer, at least one convolutional layer, and an output layer. A CNN may be a deep neural network. A CNN may be trained for identifying patterns in the transformed series of electrical impedance measurements and associating the patterns with respective battery states.

For example, the artificial neural network means may have been trained to identify a battery state of a (rechargeable) electrochemical battery of a specific chemistry type by detecting characteristic features of the transformed series of electrical impedance measurements, using training data for different voltages of batteries, for temperatures of a predetermined temperature range, and for different states of health of the batteries.

In at least one embodiment, the method comprises: measuring the electrical impedance of the electrochemical battery at different measurement frequencies to provide the series of electrical impedance measurements, using electrical impedance measuring means.

Thus, the method may be a method of measuring and analyzing electrical impedance measurements of an electrochemical battery.

For example, the series of electrical impedance measurements may be provided based on the measured electrical impedance at the different measurement frequencies.

The electrical impedance measurements may be measured in any order and/or concurrently for the respective measurement frequencies.

For example, the electrical impedance measuring means may be configured to input a signal including a respective frequency to the electrochemical battery, and determine a ratio of amplitude and phase of a response signal of the same frequency to the amplitude and phase of the input signal, the frequency of the signal and of the response signal corresponding to the measurement frequency.

For example, the electrical impedance measuring means may be electrical impedance spectroscopy measuring means configured for measuring electrical impedance of an electrochemical battery at a series of measurement frequencies. That is, the electrical impedance of the electrochemical battery is measured according to a process of electrochemical impedance spectroscopy.

Using electrochemical impedance spectroscopy, electrochemical processes in the electrochemical battery are characterized by electrical measurements that characterize the AC response of the electrochemical battery to an applied AC signal. The chemical processes in the battery, in addition to the structural configuration and the configuration of the connectors, lead to characteristic frequency dependencies of the measured impedance.

During the measurement of an electrical impedance at a specific measurement frequency, a DC offset signal (an offset voltage or an offset current) or DC bias signal may be applied to the battery, which is modulated by the AC signal of the measurement frequency.

For example, the series of electrical impedance measurements may be received from an independent measuring circuit or electrical impedance measuring means. However, an electrical impedance analyzing system may as well include electrical impedance measuring means for measuring and providing the series of electrical impedance measurements from an electrochemical battery.

For example, the electrochemical battery may be a lithium-ion battery or a lead-acid battery.

According to an aspect of the invention, there may be provided a computer-implemented method of monitoring a battery state of an electrochemical battery. The monitoring method may include the steps of the method of analyzing electrical impedance measurements. In particular, the monitoring method may include the identifying step.

For example, the method may be implemented in a battery monitoring system for monitoring a battery state of an electrochemical battery. For example, if the method is implemented in a system that is associated with a specific electrochemical battery, the steps of providing, identifying, and, optionally, adjusting, and transforming may be performed in one or more first measurement cycles, whereas in later, second measurement cycles, a modified identifying step may be performed, in which the first subseries, second subseries and third subseries within the provided series of electrical impedance measurements are identified in accordance with the identifying of a previous, first measurement cycle. For example, in case the "regular" identifying step fails due to a deterioration of the battery, the modified identifying step may be performed.

For example, the method may be implemented in a battery charging system for recharging a rechargeable electrochemical battery.

For example, in one or more first calibration cycles of the method of analyzing electrical impedance measurements, the steps of providing, identifying, and, optionally, adjusting, and transforming may be performed, wherein in a later monitoring cycle of the method, the providing step, a modified identifying step, optionally the adjusting step, and the transforming step may be performed, wherein in the modified identifying step, the first subseries, the second subseries, and the third subseries within the provided series of electrical impedance measurements are identified according to an identifying result of the identifying step of one of the calibration cycles.

Thus, the analyzing process may be self-calibrating. For example, the analyzing method may calibrate itself for a new electrochemical battery, to which an electrical impedance analyzing system implementing the method is connected, and may use the modified identifying step in further analyzing cycles of the same electrochemical battery.

Thus, the detection of differences of the battery behavior between a first analyzing cycle and later analyzing cycles is facilitated.

According to an aspect of the invention, there is provided an electrical impedance analyzing system for analyzing electrical impedance measurements of an electrochemical battery, the system comprising means for carrying out the steps of the method of analyzing electrical impedance measurements.

For example, the system may be or may be comprised in a system for monitoring a battery state of an electrochemical battery.

For example, the system may be or may be comprised in a battery charging system for recharging a rechargeable electrochemical battery.

In at least one embodiment, the system comprises computational means for receiving and processing the transformed series of electrical impedance measurements to generate therefrom at least one output signal representing a battery state associated with the electrochemical battery, wherein the computational means comprises input means configured for receiving the transformed series of electrical impedance measurements.

Preferably, the computational means include artificial neural network means configured to receive as inputs the transformed series of electrical impedance measurements.

In one or more embodiments, the electrical impedance analyzing system further comprises: electrical impedance measuring means configured for measuring the electrical impedance of the electrochemical battery at different measurement frequencies to provide the series of electrical impedance measurements.

BRIEF DESCRIPTION OF THE DRAWINGS

Preferred embodiments of the invention will now be described in conjunction with the drawings, in which.

DETAILED DESCRIPTION

Figure 1:
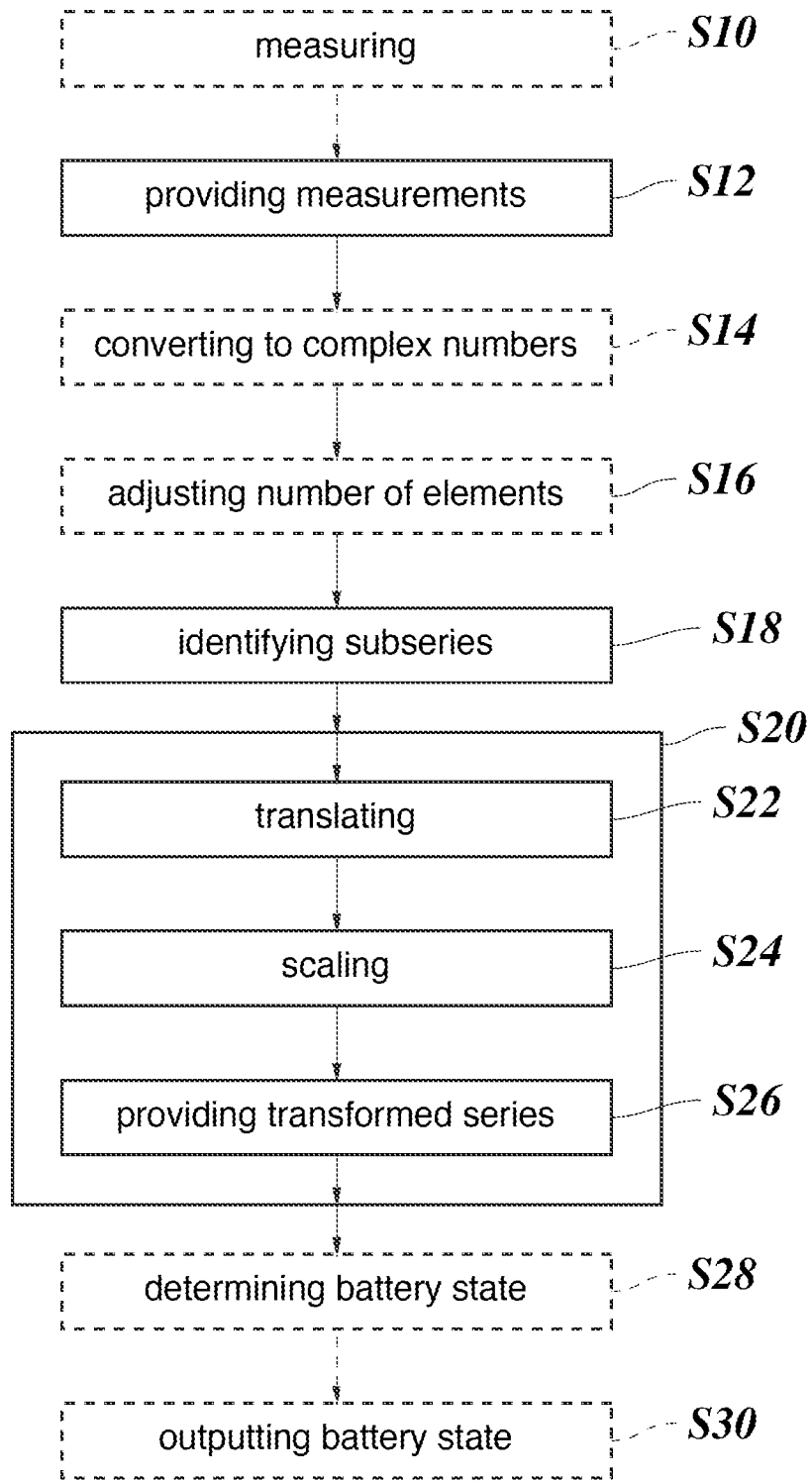
FIG. 1 is a schematic illustration of a method of analyzing electrical impedance measurements of a rechargeable electrochemical battery.

FIG. 1 schematically shows a computer-implemented method of analyzing electrical impedance measurements of a rechargeable electrochemical battery, for example, a lithium-ion battery. For example, the method may be performed by an electrical impedance analyzing system as describes further below with respect to FIG. 4 or FIG. 5.

Step S10 is a step of measuring the electrical impedance of the electrochemical battery at different measurements frequencies, using electrical impedance measuring means.

From measuring the electrical impedance, in step S12, a series of electrical impedance measurements of the electrochemical battery is provided in form of a digital signal, for example, as a data set. The series is ordered according to the respective measurement frequencies, preferably in the order of increasing measurement frequencies.

However, the method may also start with step S12 of providing the measurements, which may have been measured independently from the method, and may have been communicated to a computer performing the method.

In case the provided electrical impedance measurements are not yet in the form of complex numbers (representing complex impedance), the method may include an optional step S14 of converting the provided electrical impedance measurements to complex numbers.

In an optional step S16, the number of elements of the series of electrical impedance measurements is adjusted to a predetermined number of elements, for example, to a number of 21 elements.

The next step, step S18, is a step of identifying three subseries within the provided series of electrical impedance measurements.

Figure 2:
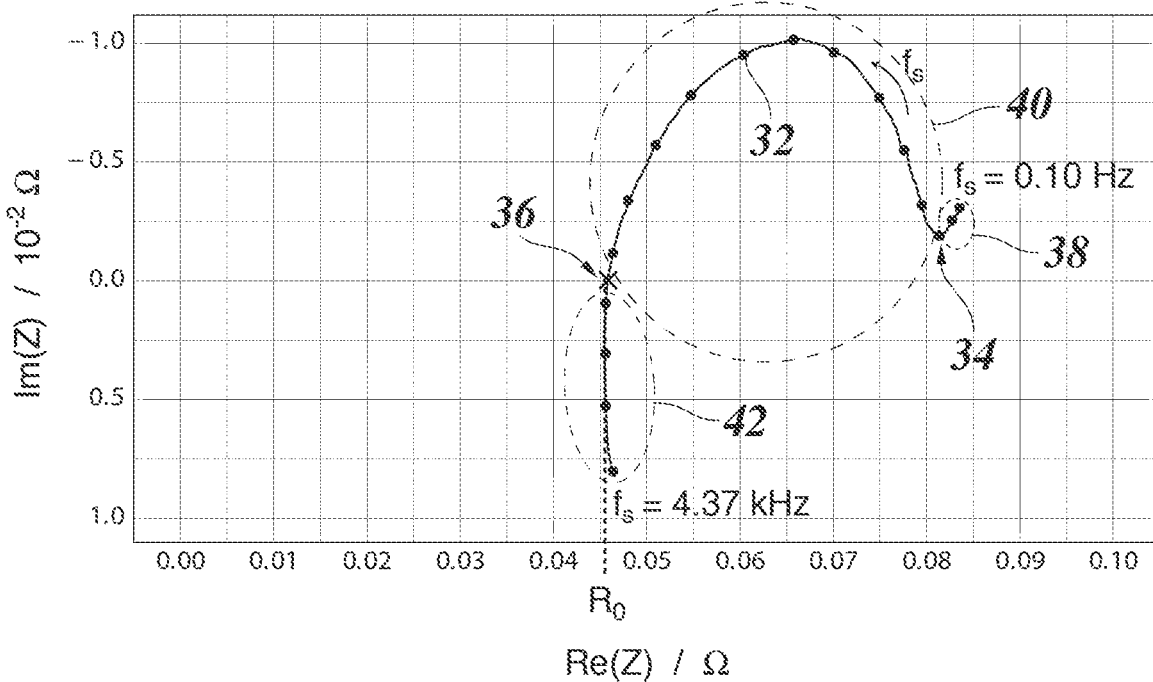
FIG. 2 is a schematic graph of a series of electrical impedance measurements of a rechargeable electrochemical battery measured at a respective measurement frequencies.

FIG. 2 exemplarily shows a series of electrical impedance measurements 32 measured at respective measurement frequencies $f_s$. FIG. 2 is a Nyquist diagram in the form of a two-dimensional graph of the imaginary part Im(Z) and the real part Re(Z) of electrical impedance Z. For illustration purposes, the elements of the series are connected by a line. According to convention, the imaginary part is displayed in an inversed direction, with the imaginary part increasing towards the bottom of FIG. 2.

From the curve progression in the complex plane of the series of measurements, there is identified a transition 34 in the form of a local minimum of the absolute value of the (negative) imaginary part Im(Z) at relatively low measurement frequencies $f_s$. The transition 34 may correspond to an element of the series of measurements, or may be determined by interpolating the measurements.

At relatively high measurement frequencies $f_s$, there is identified a zero-crossing 36 of the imaginary part Im(Z) of the electrical impedance. The zero-crossing 36 may correspond to an element 32 of the series of measurements. However, preferably, the zero-crossing 36 is determined by interpolating the measurements, as shown in FIG. 2.

As schematically shown in FIG. 2, the transition 34 is a transition between a first subseries 38 of the series of measurements at relatively low frequencies and a second subseries 40 of the series of measurements at intermediate frequencies. The zero-crossing 36 separates the second subseries 40 from a third subseries 42 of measurements having a positive imaginary part of electrical impedance Im(Z), at relatively high frequencies.

Preferably, the measurements are taken at logarithmically progressing measurement frequencies. Preferably, the series of measurements comprises at least 4 (four) measurements per decade of the measurement frequency range. In FIG. 2, the electrical impedance measurements 32 of the series of electrical impedance measurements are schematically indicated for illustration purposes, only, and range from measurement frequencies of $f_s$=0.10 Hz to $f_s$=4.37 kHz. The number of measurements illustrated in FIG. 2 may deviate from the number of measurements that are actually used, and is for illustration purposes, only.

In FIG. 2, an arrow $f_s$ shows the order of the measurements 32 with increasing measurements frequency $f_s$. The first subseries 38, which has been determined based on the identified transition 34, is identified as a subseries being associated with a battery behavior of the electrochemical battery in which the electrical impedance is dominated by diffusion processes, for example, charge carrier movements of lithium ions. Such diffusion processes dominate the AC (alternating current) behavior of the battery at lower frequencies and may result in a roughly linear correlation of the absolute value of the negative imaginary part of the impedance with the absolute value of the positive real part of the impedance in range, for example, from a lowermost frequency of the measurement frequencies to a measurement frequency close to the transition 34.

The second subseries 40, which has been determined as including those measurements between the transition 34 and the zero-crossing 36, is identified as a subseries of the series of electrical impedance measurements which subseries is associated with a battery behavior of the electrochemical battery in which the electrical impedance is dominated by charge transfer processes at the electrodes of the battery. These may be, for example, transitions of electrons from the electrodes to the lithium ions, which then diffuse towards the other electrode. In the complex plane, charge transfer processes at the anode and at the cathode may each corresponds to a round peak or arc of the absolute value of the negative impedance over the course of the real part Re(Z) of the impedance Z over the imaginary part Im(Z). In the example of FIG. 2, the two round peaks or arcs are merged to a single round peak or arc in the range between the transition 34 and the zero-crossing 36.

The third subseries 42, which is determined based on the zero-crossing 36 separating the third subseries 42 from the second subseries 40, is identified as a third subseries of the series of electrical impedance measurements, based on the zero-crossing 36.

Returning to FIG. 1, in step S20, the series of electrical impedance measurements is transformed to provide a transformed series of electrical impedance measurements.

The step of transforming S20 includes step S22 of translating, step S24 of scaling and step S26 of providing the transformed series.

In the step S22, the electrical impedance measurements of the series are translated by subtracting an ohmic AC resistance value $R_0$ from the real part of the electrical impedance. The ohmic AC resistance value $R_0$ is determined according to the real part of the electrical impedance at the (interpolated) zero-crossing 36.

In the step S24 of scaling, the translated electrical impedance measurements are scaled. In particular, the real part and the imaginary part of the electrical impedance are scaled by respective scaling factors, the absolute values of which correspond to the absolute values of the real part and the imaginary part, respectively, of the (interpolated) electrical impedance at the transition 34. Thus, the translated electrical impedance measurements are scaled to the absolute values of the imaginary part and the real part at the transition 34.

Figure 3:
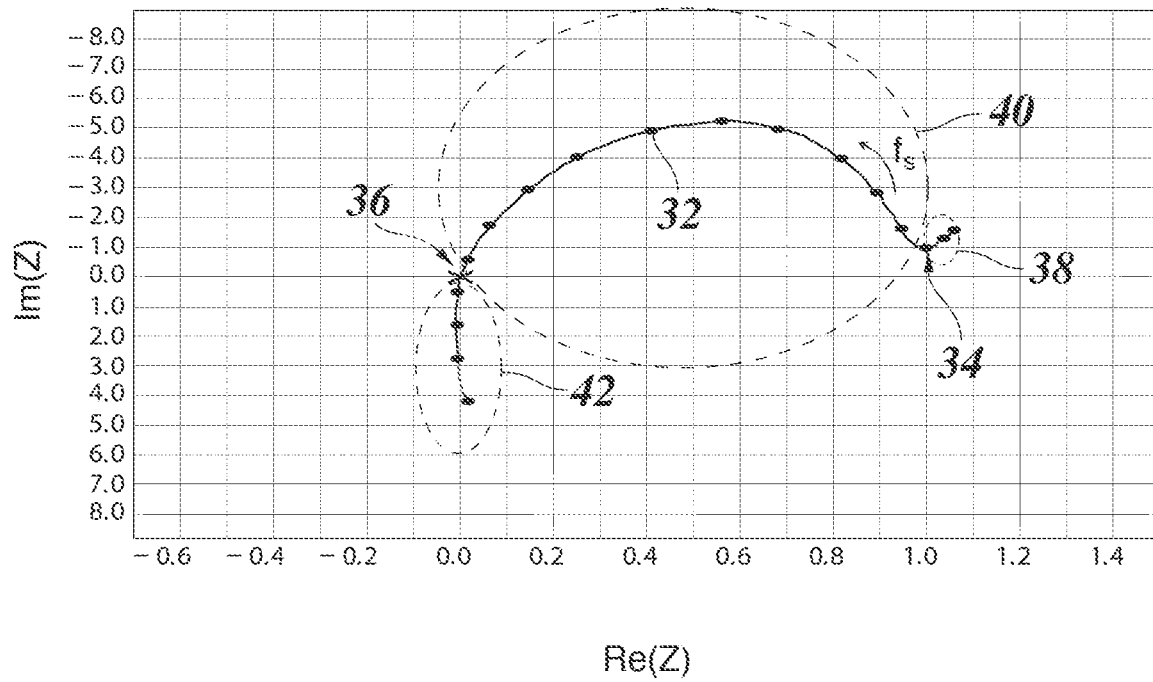
FIG. 3 is a schematic illustration showing a graph of a transformed series of electrical impedance measurements.

FIG. 3 schematically shows the transformed series of electrical impedance measurements 32 provided in step S26, after the steps S22, S24 of translating and scaling have been performed. As shown in FIG. 3, the transition 34 separating the first subseries 38 from the second subseries 40 of the transformed series of electrical impedance measurements 32 is now at the position of Re(Z)=1.0, Im(Z)=−1.0.

Furthermore, the zero-crossing 36 separating the second subseries 40 from the third subseries 42 of the transformed series of electrical impedance measurements 32 is now at the position Re(Z)=0.0, Im(Z)=0.0.

Returning to FIG. 1, the method may optionally include step S28 of the determining a battery state. In step S28, a battery state to the electrochemical battery is determined using computational means configured to receive as inputs the transformed series of electrical impedance measurements 32, as will be explained further below with respect to FIG. 4. The computational means receive and process the transformed series of electrical impedance measurements to generate therefrom an output signal representing the battery state. In step S30, the battery state is output.

In another example of the method, the step S16 of adjusting may be performed after the step S18 of identifying the subseries. For example, the number of elements of each of the first subseries, second subseries, and third subseries of the transformed series of electrical impedance measurements may be adjusted to a respective predetermined number of elements based on the identified subseries.

Figure 4:
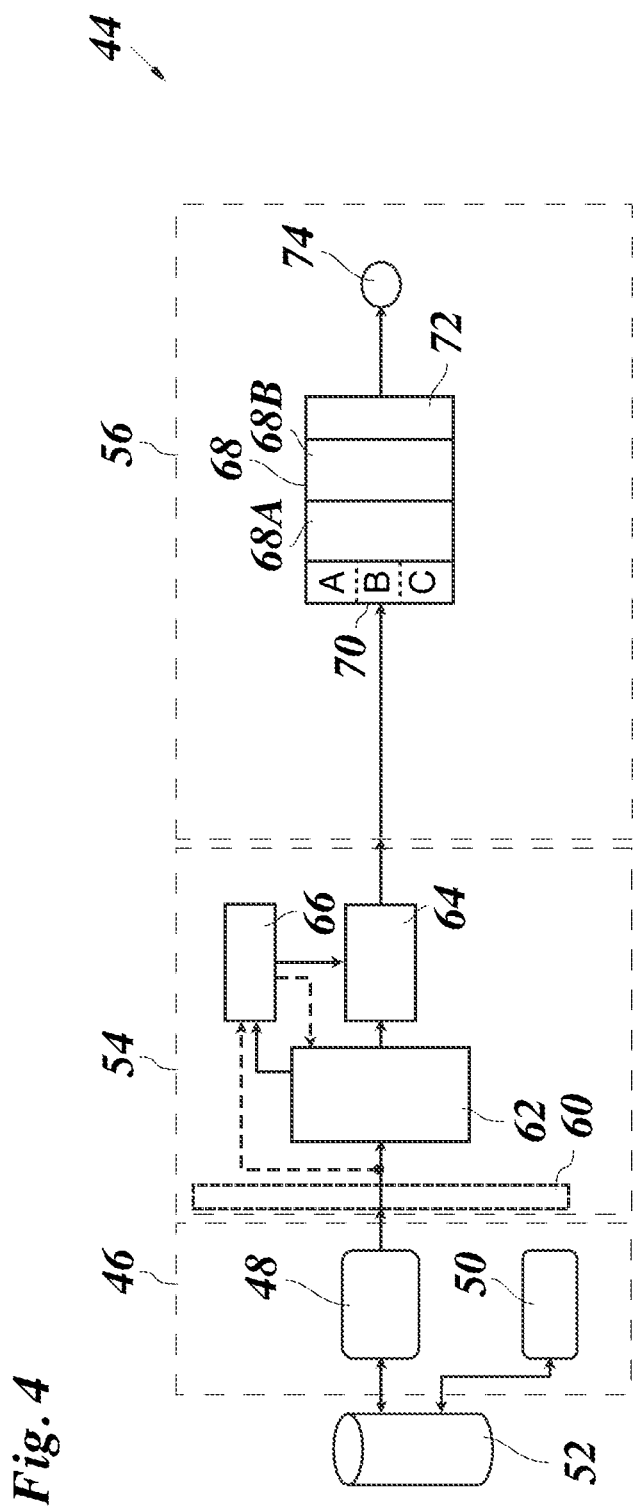
FIG. 4 is a schematic illustration of an electrical impedance analyzing system for analyzing electrical impedance measurements of a rechargeable electrochemical battery.
Figure 5:
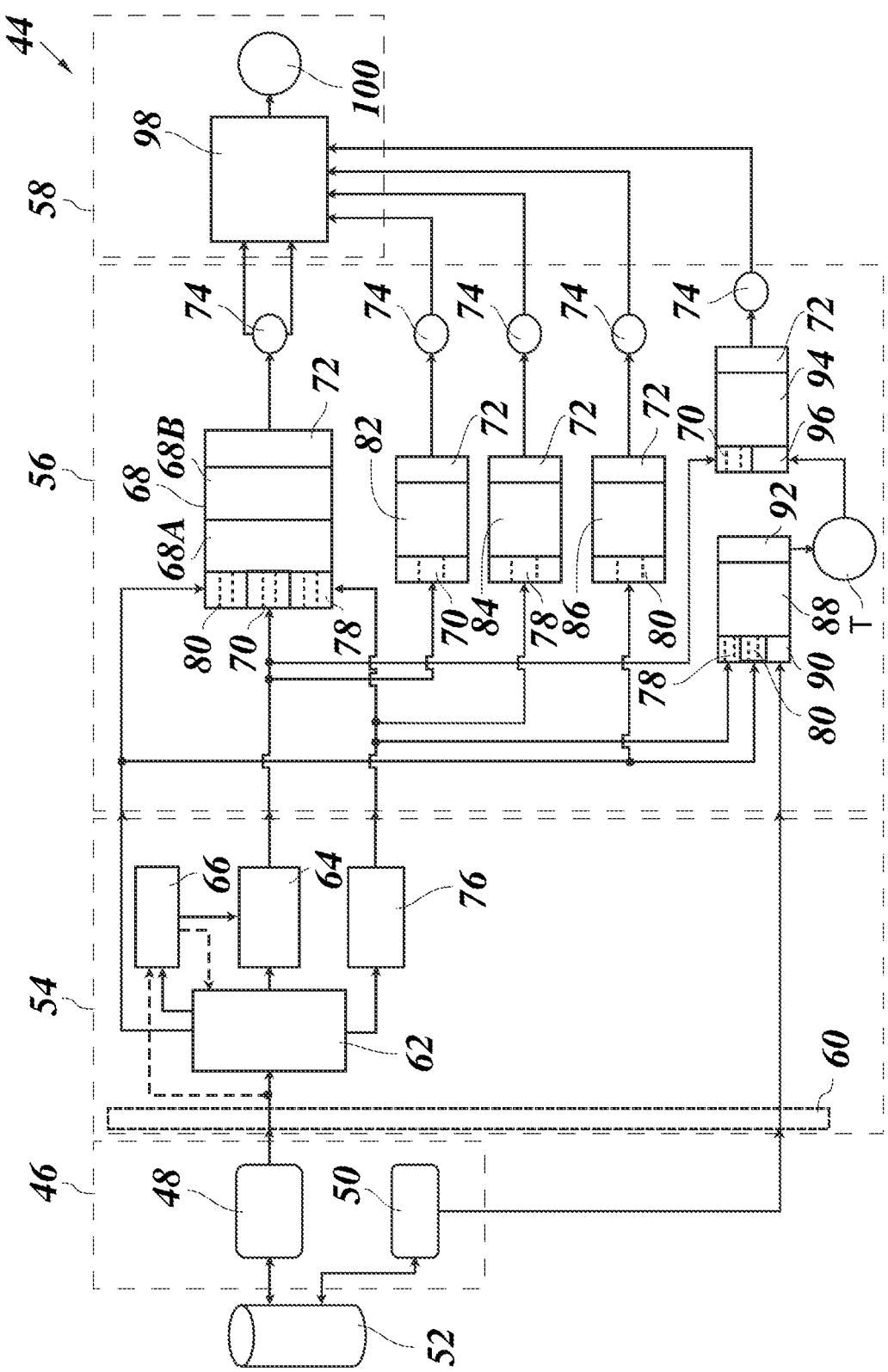
FIG. 5 is a schematic illustration of a further electrical impedance analyzing system for analyzing electrical impedance measurements of a rechargeable electrochemical battery.

FIG. 4 and FIG. 5 schematically show examples of an electrical impedance analyzing system 44 configured for performing the method of FIG. 1, the system optionally including electrical impedance measuring means 46. For example, the electrical impedance analyzing system 44 of FIG. 4 or FIG. 5 may be implemented in a computer such as a microcontroller. For example, the microcontroller including the system 44 and, optionally, the electrical impedance measuring means 46 may be part of a battery monitoring system for monitoring a battery state of a rechargeable electrochemical battery 52. For example, the system 44 of FIG. 4 or FIG. 5 may be part of a battery charging system configured for recharging a rechargeable electrochemical battery 52.

The electrical impedance measuring means 46 includes an electrical impedance measuring unit 48 and a voltage measuring unit 50. In the system of FIG. 4, the electrical impedance analyzing system 44 further includes a pre-processing unit 54 and computational means 56. FIG. 5 shows a further example of an electrical impedance analyzing system 44 that includes electrical impedance measuring means 46, a pre-processing unit 54, computational means 56, and a post processing unit 58. Similar elements or parts of the systems 44 of FIG. 4 and FIG. 5 are denoted with the same reference signs. Common features of the systems of FIG. 4 and FIG. 5 will be described first, in the following.

For a series of measurement frequencies $f_s$, the electrical impedance measuring unit 48 applies an excitation signal, for example a sinusoidal signal, to an electrochemical battery 52 that is to be measured. The signal is input in the form of a small amplitude alternating current (AC) signal, and the alternating current response from the battery 52 is measured. For example, a current signal is input, and a voltage response signal is measured. Alternatively, a voltage signal is input, and a current response signal is measured. During the measurements, a direct current (DC) bias voltage or DC bias current may be applied in accordance with the type of the electrochemical battery 52. The measuring setup corresponds to electrochemical impedance spectroscopy (EIS) measurement setups known as such. The measurement frequencies are arranged or increased in equidistant steps on a logarithmic scale, for the respective measurements, in accordance with a measurement setup that is predetermined for the type of the rechargeable electrochemical battery 52, for example, according to a battery ID read out from the battery 52. For example, the battery type may be read out by the battery charging system from the battery 52 in the form of an identification number (ID) that is associated with charging parameters for the battery 52.

The measured electrical impedance at a specific measurement frequency is the ratio of the amplitude and phase of the AC response signal to the amplitude and phase of the input signal and is represented as a complex number (complex impedance). For example, four different measurements frequencies may be used per decade of the measurement frequencies.

In addition, the voltage unit 50 measures the overall battery voltage of the battery 52 before and after the electrical impedance measurements. In particular, the overall battery voltage may be a respective DC voltage.

The pre-processing unit 54 includes input means 60 for providing the series of electrical impedance measurements 32 from the electrical impedance measurement means 46.

Furthermore, the pre-processing unit 54 includes standardizing means 62 for adjusting the number of elements of the series of electrical impedance measurements to a predetermined number of elements, for example, 21 elements. For example, the number of elements may be adjusted by interpolating the elements of the series. In case that the series of electrical impedance measurements provided by the input means 60 already has the target value of the predetermined number of elements, the standardizing means 62 maintains the number of elements.

The pre-processing unit 54 further includes transforming means 64 and identifying means 66. The identifying means 66 identify the first subseries, second subseries and third subseries within the standardized series of electrical impedance measurements received from the standardizing means 62, for example, in accordance with the identifying step S18 of FIG. 1, and provide identification information identifying the subseries 38, 40, 42 and/or the transition 34 and zero-crossing 36 to the transforming means 64. The transforming means 64 translate and scale the standardized series of electrical impedance measurements received from the standardizing means 62. For example, the transforming means 64 may perform the translation and scaling steps S22, S24 of FIG. 1. Thus, the transforming means 64 subtract the ohmic AC resistance value $R_O$ from the electrical impedance measurements, and normalize the measurements to the point of the transition 34 between the first subseries 38 and the second subseries 40, as explained with regard to FIG. 2 and FIG. 3.

In particular, due to the measurement setup being configured for the type of the battery 52, it is assured that number of elements of the transformed first subseries is adjusted to a predetermined first number of elements, and that the number of elements of the transformed second subseries of the transformed series of electrical impedance measurements is adjusted to a predetermined second number of elements. Likewise, the number of elements of the transformed third subseries of the transformed series of electrical impedance measurements may be adjusted to a predetermined third number of elements. The predetermined numbers may be determined from test measurements for a given battery type and shall ensure that enough elements are acquired for each of the relevant subseries of the measurements to represent features of the associated respective battery behavior.

The computational means 56 include artificial neural network means 68 having input means 70 for receiving the standardized and transformed series of electrical impedance measurements from the pre-processing unit 54. The input means 70 include first inputs A for the transformed first subseries 38, second inputs B for the transformed second subseries 40, and third inputs C for the transformed third subseries 42.

Furthermore, the artificial neural network means 68 include output means 72 for outputting an output signal representing a battery state associated with the electrochemical battery 52. The artificial neural network means 68 receives and processes the standardized and transformed series of electrical impedance measurements and generates therefrom the output signal.

The artificial neural network means 68 includes a convolutional neural network 68A (CNN), or a convolutional deep neural network, and a deep neural network 68B (DNN) connected at the output side of the convolutional neural network. The CNN 68A detects characteristic features of the transformed series of measurements, and the DNN 68B determines an estimation for a battery state 74 based on the detected characteristic features. The artificial neural network means 68 has been trained to identify a battery state of a rechargeable electrochemical battery by detecting characteristic features of the transformed series of electrical impedance measurements (that is, the standardized and transformed electrical impedance spectroscopy measurements). A convolutional neural network is particularly advantageous for detecting characteristic patterns in normalized shapes of the curved progression of electrical impedance spectroscopy measurements.

The determined battery state 74 is output by the output means 72. For example, the output signal may represent a state of health (SoH) of the battery 52.

The system 44 of FIG. 5 includes the features and elements described above with respect to the system of FIG. 4. Additional features and elements are described in the following.

In the example of FIG. 5, the pre-processing unit 54 further includes gradient calculating means 76 that receive the standardized series of electrical impedance measurements from the standardizing means 62. The gradient calculating means 76 calculate gradients of the real part of the series of measurements and gradients of the imaginary part of the series of measurements with respect to the measurement frequency, with respect to a logarithm of the measurement frequency, or with respect to the index of the elements of the series of measurements. Thus, the gradient calculating means 76 generate a series of electrical impedance gradients from the standardized series of electrical impedance measurements.

In the example of FIG. 5, the computational means 56 receive the series of electrical impedance gradients from the gradient calculating means 76. In particular, the (first) artificial neural network means 68 receives, by further input means 78, the series of electrical impedance gradients. Moreover, the artificial neural network means 68 receives at a still further input means 80 the standardized series of electrical impedance measurements directly from the standardizing means 62. The artificial neural network means 68 generates the output signal from the inputs of input means 70, 78 and 80. The input means 78 include first inputs for the gradients of the first subseries 38, second inputs for the gradients of the second subseries 40, and third inputs for the gradients of the third subseries 42. The input means 80 include first inputs for the first subseries 38, second inputs for the second subseries 40, and third inputs for the third subseries 42.

In the example of FIG. 5, the computational means 56 further include second artificial neural network means 82 having input means 70 and output means 72. The second neural network means 82 is, for example, a deep neural network (DNN) and further differs from the artificial neural network means 68 in that the second neural network means 62 does receive the standardized and transformed series of electrical impedance measurements from the scaling means 64, but does not receive the standardized series directly from the standardizing means 62, nor the series of gradients from the gradient calculating means 76. The second neural network means 82 generates an output signal representing a battery state 74.

Furthermore, the computational means 56 include a third artificial neural network means 84 having input means 78, output means 72 and generating an output signal representing a battery state 74 from the series of electrical impedance gradients received from the gradient calculating means 76.

Furthermore, the computational means 56 include a fourth artificial neural network means 86 having input means 80 and output means 72 and generating an output signal representing a battery state 74 from the standardized series of electrical impedance measurements received directly from the standardizing means 62.

Furthermore, the computational means 56 include a fifth artificial neural network means 88 having input means 78 for receiving the series of electrical impedance gradients from the gradient calculating means 76, further input means 80 for receiving the standardized series of electrical impedance measurements from the standardizing means 62, and further input means 90 for receiving the measured battery DC voltages from the voltage measuring unit 50 via the input means 60 of the preprocessing unit 54. The fifth artificial neural network means 88 has output means 92 and generates from the inputs an output signal at the output means 92 representing a battery temperature T of the electrochemical battery 52.

The computational means 56 further includes a sixth artificial neural network means 94 having input means 96 for receiving the temperature T from the fifth neural network means 88. Furthermore, the sixth neural network means 94 comprises input means 70 for receiving the standardized and transformed series of electrical impedance measurements from the transforming means 64. The sixth neural network means 94 has output means 72 for outputting a generated output signal representing a battery state 74, and generates from the inputs the output signal representing the battery state 74.

The second, third, fourth, fifth and sixth artificial neural network means 82, 84, 86, 88, 94 may, for example, be deep neural networks or convolutional neural networks.

The system may also be implemented using only one or only some of the artificial neural network means 68, 82, 84, 86, 88, and 94, for example, the neural network means 68, 86 receiving directly the standardized series of electrical impedance measurements from the standardizing means 62, and/or the neural network means 68, 84 receiving the series of electrical impedance gradients from the gradient calculating means 76. These may optionally be combined with the temperature related neural network means 88 and 94.

A post processing unit 58 includes a majority voting unit 98 that receives the output signals representing the battery state 74 from the first artificial neural network means 68, the second artificial neural network means 82, the third artificial neural network means 84, the fourth artificial neural network means 86, and the sixth artificial neural network means 94. The inputs to the majority voting unit 98 are weighted. In particular, in the example of FIG. 5, the battery state 74 of the output signal of the first artificial neural network means 68 is weighted by a factor of two, that is, is counted as two input signals, whereas the other inputs from the second, third, fourth and sixth neural network means 82, 84, 86, 94 are each weighted by a factor of one, that is, counted as a single input. The majority voting unit 98 generates an output signal from the weighted input signals, the output signal representing a battery state 100 of the electrochemical battery 52.

In particular, the majority voting unit 98 is configured to detect outliers amongst the input signals (that is, battery states 74), and to calculate an average value of the battery state 100 from the remaining inputs of the battery state 74. For example, an input signal that has a largest deviation from the median or from the average of the other input signals may be detected as an outlier and discarded.

The battery state 100 as determined by the majority voting unit 98 of the post processing unit 58 is provided by the electrical impedance measurement system 44 as an output signal representing the battery state 100.

In the examples of FIG. 4 and FIG. 5, the battery state 74 and 100 is a state of health of the electrochemical battery 52. However, a similar system may be used for generating an output signal representing a state of charge of the electrochemical battery 52, or a battery state in the form of a battery temperature of the electrochemical battery 52. In the latter case, the output signal of the fifth artificial neural network means 88 of FIG. 5 may be received at an input of the majority voting unit 98 instead of or in addition to the output signal of the sixth artificial neural network means 94.

Furthermore, the electrical impedance analyzing system 44 may include additional computational means 56 and, in case of the example of FIG. 5, additional post processing units 58, for each respective battery state that is to be determined, such as, for example, state of charge or a battery temperature. In this case, respective output signals representing the respective battery states 74 or 100 are output from the respective neural networks or, respectively, the post processing unit 58.

In the example of FIGS. 4 and 5, the identifying means 66 receive the standardized series of electrical impedance measurements from the standardizing means 62.

In another example of the electrical impedance analyzing system 44, as indicated with dashed arrows in FIGS. 4 and 5, the identifying means 66 may receive the series of electrical impedance measurements 32 from the input means 60, instead, and may output the identification information to the standardizing means 62. The standardizing means 62 may adjust the numbers of the subseries based on the identified subseries.

What is claimed is:

1. A computer-implemented method of analyzing electrical impedance measurements of an electrochemical battery, the method comprising:
    measuring the electrical impedance of the electrochemical battery at different measurement frequencies to provide a series of electrical impedance measurements of an electrochemical battery, each electrical impedance measurement being measured at a respective measurement frequency, the series being ordered according to the respective measurement frequencies,
    identifying at least three subseries within the provided series of electrical impedance measurements, a first subseries of the three subseries being associated with a battery behavior of the electrochemical battery in which the electrical impedance is dominated by diffusion processes, a second subseries of the three subseries being associated with a battery behavior of the electrochemical battery in which the electrical impedance is dominated by charge transfer processes at electrodes of the battery, a third subseries of the three subseries being separated from the second subseries at a position that corresponds to a zero-crossing in a complex plane of an imaginary part of electrical impedance, and
    transforming at least the first subseries and the second subseries of the series of electrical impedance measurements to provide a transformed series of electrical impedance measurements, the transformed series of electrical impedance measurements having a predetermined number of elements, the transformed series of electrical impedance measurements including a transformed first subseries corresponding to the first subseries of the electrical impedance measurements and a transformed second subseries corresponding to the second subseries of the electrical impedance measurements, the transforming including:
        a translating of the respective electrical impedance measurements that corresponds to subtracting an ohmic alternating current resistance value from a real part of electrical impedance, wherein the ohmic alternating current resistance value is determined according to the real part of electrical impedance at the zero-crossing in the complex plane of the imaginary part of electrical impedance which zero-crossing in the complex plane corresponds to the position at which the third subseries of the three subseries is separated from the second subseries;
        a scaling of the respective translated electrical impedance measurements that corresponds to scaling the real part and the imaginary part of electrical impedance by respective scaling factors, absolute values of which are determined based on the absolute values of the real part and the imaginary part, respectively, of an electrical impedance that corresponds to a transition between the translated first subseries of the series of electrical impedance measurements and the translated second subseries of the series of electrical impedance measurements; and
    determining a battery state of the electrochemical battery using a computing device configured to receive as inputs the transformed series of electrical impedance measurements,
    wherein the computing device receives and processes the transformed series of electrical impedance measurements to generate therefrom at least one output signal representing a battery state associated with the electrochemical battery.

2. The method of claim 1, wherein, in the transformed series of electrical impedance measurements, each of the transformed first subseries and the transformed second sub series have a respective predetermined number of elements.

3. The method of claim 1, wherein the method further comprises:
    adjusting the number of elements of the series of electrical impedance measurements to a predetermined number of elements,
    wherein the number of elements of each of the transformed first subseries and transformed second subseries of the transformed series of electrical impedance measurements is adjusted to a respective predetermined number of elements.

4. The method of claim 1, wherein the step of identifying comprises determining a local relative maximum of the imaginary part of the series of electrical impedance measurements, the local relative maximum being separated by other elements of the series of electrical impedance measurements from a zero-crossing in the complex plane of the imaginary part of electrical impedance of the series of electrical impedance measurements, wherein the local relative maximum is a local relative maximum when smoothing and/or interpolating the series of electrical impedance measurements.

5. The method of claim 4, wherein the first subseries and the second subseries are identified based on the determined local relative maximum of the imaginary part of the series of electrical impedance measurements.

6. The method of claim 1, wherein the step of identifying comprises determining a transition between one subseries of the series of electrical impedance measurements and a further subseries of the series of electrical impedance measurements, wherein the one subseries of electrical impedance measurements has imaginary parts of electrical impedance that are negative and that have a magnitude which basically decreases towards the transition, and wherein the further subseries of electrical impedance has imaginary parts of electrical impedance that are negative and that have a magnitude which basically increases and then basically decreases towards the transition.

7. The method of claim 6, wherein the first subseries and the second subseries are identified based on the determined transition between the one subseries of the series of electrical impedance measurements and the further subseries of the series of electrical impedance measurements.

8. The method of claim 1, wherein the computing device includes artificial neural network configured to receive as inputs the transformed series of electrical impedance measurements.

9. The method of claim 1, wherein the computing device receives and processes the transformed series of electrical impedance measurements to generate therefrom at least one output signal representing a state of charge of the electrochemical battery.

10. The method of claim 1, wherein the computing device receives and processes the transformed series of electrical impedance measurements to generate therefrom at least one output signal representing a state of health of the electrochemical battery.

11. The method of claim 1, wherein the computing device receives and processes the transformed series of electrical impedance measurements to generate therefrom at least one output signal representing a state of function of the electrochemical battery.

12. An electrical impedance analyzing system for analyzing electrical impedance measurements of an electrochemical battery, the system comprising:
an electrical impedance measuring device configured to measure the electrical impedance of the electrochemical battery at different measurement frequencies to provide a series of electrical impedance measurements of an electrochemical battery, each electrical impedance measurement being measured at a respective measurement frequency, the series being ordered according to the respective measurement frequencies,
a pre-processing unit configured to:
identify at least three subseries within the provided series of electrical impedance measurements, a first subseries of the three subseries being associated with a battery behavior of the electrochemical battery in which the electrical impedance is dominated by diffusion processes, a second subseries of the three subseries being associated with a battery behavior of the electrochemical battery in which the electrical impedance is dominated by charge transfer processes at electrodes of the battery, a third subseries of the three subseries being separated from the second subseries at a position that corresponds to a zero-crossing in a complex plane of an imaginary part of electrical impedance, and
transform at least the first subseries and the second subseries of the series of electrical impedance measurements to provide a transformed series of electrical impedance measurements, the transformed series of electrical impedance measurements having a predetermined number of elements, the transformed series of electrical impedance measurements including a transformed first subseries corresponding to the first subseries of the electrical impedance measurements and a transformed second subseries corresponding to the second subseries of the electrical impedance measurements, the transforming including:
a translating of the respective electrical impedance measurements that corresponds to subtracting an ohmic alternating current resistance value from a real part of electrical impedance, wherein the ohmic alternating current resistance value is determined according to the real part of electrical impedance at the zero-crossing in the complex plane of the imaginary part of electrical impedance which zero-crossing in the complex plane corresponds to the position at which the third subseries of the three subseries is separated from the second subseries; and
a scaling of the respective translated electrical impedance measurements that corresponds to scaling the real part and the imaginary part of electrical impedance by respective scaling factors, absolute values of which are determined based on the absolute values of the real part and the imaginary part, respectively, of an electrical impedance that corresponds to a transition between the translated first subseries of the series of electrical impedance measurements and the translated second subseries of the series of electrical impedance measurements; and
a computing device configured to determine a battery state of the electrochemical battery by receiving as inputs the transformed series of electrical impedance measurements,
wherein the computing device receives and processes the transformed series of electrical impedance measurements to generate therefrom at least one output signal representing a battery state associated with the electrochemical battery.

13. The electrical impedance analyzing system of claim 12, wherein the computing device is further configured to receive and process the transformed series of electrical impedance measurements to generate therefrom at least one output signal representing a battery state associated with the electrochemical battery, wherein the computing device comprises an input configured for receiving the transformed series of electrical impedance measurements.

14. The electrical impedance analyzing system of claim 13, wherein the computing device include artificial neural network configured to receive as inputs the transformed series of electrical impedance measurements.

* * * * *